(12) United States Patent
Boiron et al.

(10) Patent No.: US 9,218,562 B2
(45) Date of Patent: Dec. 22, 2015

(54) METHOD FOR PRODUCING A CONTACTLESS MICROCIRCUIT

(71) Applicant: INSIDE SECURE, Meyreuil (FR)

(72) Inventors: Ghislain Boiron, Aix en Provence (FR); Pierre Pic, Ceyreste (FR)

(73) Assignee: INSIDE SECURE, Aix-en-Provence (FR)

( * ) Notice: Subject to any disclaimer, the term of this patent is extended or adjusted under 35 U.S.C. 154(b) by 0 days.

(21) Appl. No.: 14/412,491

(22) PCT Filed: May 3, 2013

(86) PCT No.: PCT/FR2013/050982
§ 371 (c)(1),
(2) Date: Jan. 2, 2015

(87) PCT Pub. No.: WO2014/006286
PCT Pub. Date: Jan. 9, 2014

(65) Prior Publication Data
US 2015/0186769 A1    Jul. 2, 2015

(30) Foreign Application Priority Data
Jul. 2, 2012  (FR) .................................. 12 01866

(51) Int. Cl.
*G06K 19/06* (2006.01)
*G06K 19/077* (2006.01)

(52) U.S. Cl.
CPC .... *G06K 19/07783* (2013.01); *G06K 19/07749* (2013.01); *G06K 19/07754* (2013.01); *G06K 19/07773* (2013.01); *G06K 19/07775* (2013.01); *H01L 2224/48091* (2013.01); *H01L 2224/48228* (2013.01)

(58) Field of Classification Search
USPC ......................................................... 235/492
See application file for complete search history.

(56) References Cited

U.S. PATENT DOCUMENTS

| | | | | |
|---|---|---|---|---|
| 5,598,032 A * | 1/1997 | Fidalgo | .......................... | 257/679 |
| 8,366,009 B2 * | 2/2013 | Finn et al. | ...................... | 235/492 |
| 8,723,744 B2 * | 5/2014 | Grasset | ......................... | 343/742 |
| 2002/0089049 A1 | 7/2002 | Leduc et al. | | |
| 2002/0125546 A1* | 9/2002 | Muta | ............................. | 257/531 |
| 2003/0025186 A1 | 2/2003 | Leduc et al. | | |
| 2008/0283615 A1 | 11/2008 | Finn | | |

FOREIGN PATENT DOCUMENTS

WO    9726621 A1    7/1997

OTHER PUBLICATIONS

Aug. 7, 2013 International Search Report issued in International Patent Application No. PCT/FR2013/050982.
Aug. 7, 2013 Written Opinion issued in International Patent Application No. PCT/FR2013/050982.

* cited by examiner

*Primary Examiner* — Christle I Marshall
(74) *Attorney, Agent, or Firm* — Oliff PLC

(57) ABSTRACT

The invention relates to a method for manufacturing a contactless microcircuit antenna coil, including steps of: depositing a first electrically conducting layer on a first face of a wafer, and forming in the first layer an antenna coil in a spiral having several turns, including an internal turn coupled to an internal contact pad and an external turn coupled to an external contact pad, the external turn following the entire contour of antenna coil except for a zone through which a conducting path coupling the external contact pad to the external turn can pass, the external and internal contact pads of the antenna coil being formed in a central zone of the external turn, the antenna coil having a bypass zone in which each turn bypasses the external contact pad.

18 Claims, 7 Drawing Sheets

METHOD FOR PRODUCING A CONTACTLESS MICROCIRCUIT

Figure 1:
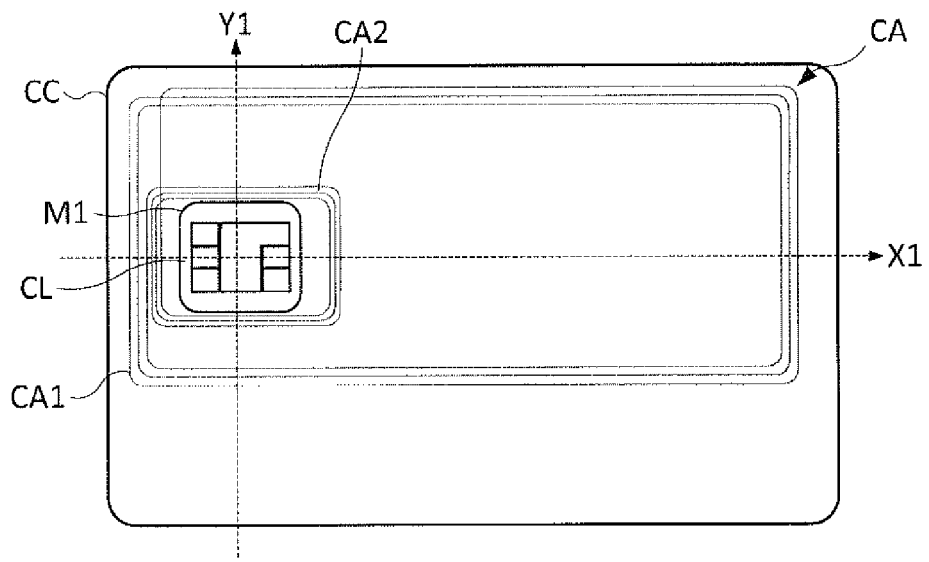

The present invention relates to contactless microcircuits or contactless integrated circuits, and in particular contactless microcircuits integrated into an object such as a plastic card (polymer resin).

Contactless or near field communication NFC microcircuits have been developed to be able to perform transactions with a terminal, by inductive coupling or electric field coupling.

To make a communication by inductive coupling in particular, a sufficient inductive coupling factor must be obtained between an antenna coil of the terminal and an antenna coil connected to the microcircuit. This coupling factor depends on the respective sizes of the antenna coils of the terminal and of the microcircuit, and on the relative distance and positions of these two coils. The closer the size of the microcircuit coil is to that of the terminal, the higher the coupling factor between the two coils can be.

Generally, antenna coils of terminals have dimensions greater than those of a card in ISO 7816 format. It is thus desirable that the antenna coil of the microcircuit be as large as possible. However, the larger this coil is in relation to the microcircuit, the more difficult it is to produce a reliable connection between the coil and the microcircuit that is sufficiently strong to withstand frequent handling. In the case of contactless microcircuit cards, the cards are made of polymer resin, generally PVC (polyvinyl chloride), PC (polycarbonate), or PET (polyethylene terephthalate), and are thus deformable. It transpires that repeated deformations of the card can lead to the connection between the coil and the microcircuit breaking, which puts the microcircuit definitively out of service.

U.S. Pat. No. 5,955,723 suggests producing an inductive coupling between a large coil formed on the card, and a small coil connected to the microcircuit. The large coil comprises a small loop having substantially the dimensions of the coil of the microcircuit. The inductive coupling is made by making the center of the microcircuit coil coincide with that of the small loop.

The present invention relates more particularly to the manufacturing of a module comprising a microcircuit connected to an antenna coil capable of being coupled by induction with an antenna coil formed on an object such as a card made of polymer resin. Such a module generally comprises a double-sided printed circuit wafer on which contact pads are formed on one side, on a front face, and an antenna coil is formed in the form of a spiral with several windings on the other side, on a rear face. The microcircuit is generally secured onto a zone in the center of the antenna coil. The connection of the contact pads to the microcircuit is generally done through conductive vias and wires disposed between the microcircuit and the conductive vias.

However, the antenna coil generally has a contact inside the spiral (in the central zone of the antenna coil) and a contact outside. The connection of the microcircuit to the contact inside the antenna coil can be done merely using a wire. However, the connection of the microcircuit to the contact outside the antenna coil is problematic. Indeed, the module comprising the microcircuit and the wafer are then secured into a cavity formed in the card, the microcircuit and the connecting wires being embedded in an electrically insulating mechanical protection layer of resin, limited to the central zone of the antenna coil. The wire ensuring the connection between the external contact and the microcircuit must access a zone outside the central zone of the antenna coil and must thus pass outside the protection layer of resin.

Generally, the connection between the external contact of the antenna coil and the microcircuit is done through two additional conductive vias and a connecting path between the conductive vias formed on the face of the wafer where the contact pads are located. One of the two additional conductive vias opens onto the outside of the antenna coil in the external contact of the antenna coil, whereas the other conductive via opens onto the inside of the antenna coil in a contact pad which is coupled to the microcircuit by a connecting wire.

It transpires that the formation of such conductive vias significantly increases the cost of manufacturing the contactless module. To remove the conductive vias between the contact pads and the microcircuit, one well-known method involves forming holes in the wafer down to the layer of metal forming the contact pads, so that each contact is made accessible from the rear face of the wafer. A wire can then be secured to each contact at the bottom of the holes, and connected to the microcircuit. However, there does not seem to be any solution for removing the conductive via used to electrically couple the external contact of the antenna coil to the front face of the wafer.

It is thus desirable to design a module associated with an antenna coil without having to form such conductive vias in the wafer supporting the antenna coil.

Some embodiments relate to a method for manufacturing a contactless microcircuit antenna coil, comprising steps of; depositing a first electrically conducting layer on a first face of a wafer, and forming in the first layer an antenna coil in a spiral comprising several turns, comprising an internal turn coupled to a contact pad inside the internal turn and an external turn coupled to an external contact pad. The external and internal contact pads of the antenna coil are formed in a central zone of the external turn, the external turn following the entire contour of antenna coil except for a zone through which a conducting path coupling the external contact pad to the external turn can pass, the antenna coil comprising a bypass zone in which each turn bypasses the external contact pad through the central zone.

According to one embodiment, the bypass zone of the antenna coil is pre-formed to support a microcircuit across the entire width and at least partially over the length of the latter.

According to one embodiment, the layer comprises a support structure for supporting a microcircuit, the support structure being able to be coupled to the internal turn of the antenna coil.

According to one embodiment, the method comprises steps of: depositing a second electrically conducting layer on a second face of the wafer, forming contact pads in the second layer, and forming holes in the wafer from the first layer, until they reach the contact pads of the second layer.

Some embodiments also relate to a method for manufacturing a contactless module, comprising steps of: executing the method as defined above, securing a microcircuit onto a central zone of the antenna coil, and coupling contact pads of the microcircuit to the contact pads of the antenna coil, through wires.

According to one embodiment, the method comprises steps of: depositing a second electrically conducting layer on a second face of the wafer, forming contact pads in the second layer, and forming holes in the wafer from the first layer, until they reach the contact pads of the second layer, and coupling contact pads of the microcircuit to the contact pads of the second layer through wires passing in the holes.

According to one embodiment, the method comprises a step of depositing an electrically insulating protection layer on the microcircuit and the connecting wires.

According to one embodiment, the wafer belongs to a board in which several contactless modules are collectively formed, the method comprising a step of cutting the board to individualize the modules, performed after connecting each microcircuit.

Some embodiments also relate to a method for manufacturing a microcircuit card comprising steps of: executing the method for manufacturing a contactless module as defined above, forming an antenna coil in a card, and implanting the module into the card, the antenna coil of the card having a part close to the antenna coil of the microcircuit to establish a coupling by induction between the two antenna coils.

According to one embodiment, the card belongs to a board in which contactless microcircuit cards are collectively formed, the method comprising a step of cutting the board to individualize the cards, performed after forming the card antenna coils in the board, and before implanting one module into each card.

Some embodiments also relate to a contactless microcircuit antenna coil, comprising: a wafer covered on a first face with a first layer in which an antenna coil is formed, the antenna coil comprising several turns in a spiral, including an internal turn coupled to a contact pad inside the internal turn and an external turn coupled to an external contact pad. The external and internal contact pads of the antenna coil are formed in a central zone of the external turn, the external turn following the entire contour of antenna coil except for a zone through which a conducting path coupling the external contact pad to the external turn can pass, the antenna coil comprising a bypass zone in which each turn bypasses the external contact pad.

According to one embodiment, the turns in the bypass zone are pre-formed to support a microcircuit across the entire width and at least partially over the length of the latter.

According to one embodiment, the first layer comprises a support structure to support a microcircuit, the support structure being able to be coupled to the internal turn of the antenna coil.

According to one embodiment, the antenna coil comprises a second electrically conducting layer covering a second face of the wafer, the second layer forming contact pads, holes passing through the wafer from the first face, until they reach the contact pads of the second layer.

Some embodiments also relate to a contactless module comprising: an antenna coil as defined above, and a microcircuit secured onto a central zone of the antenna coil and comprising contact pads coupled to the contact pads of the antenna coil through wires.

According to one embodiment, the contactless module comprises a second electrically conducting layer covering a second face of the wafer, the second layer forming contact pads, and wires coupling contact pads of the microcircuit to the contact pads of the second layer, by passing through holes formed in the wafer from the first layer, and reaching the contact pads of the second layer.

According to one embodiment, the contactless module comprises an electrically insulating protection layer covering the microcircuit and the connecting wires.

Some embodiments also relate to a microcircuit card comprising an antenna coil and a module as defined above, the antenna coil of the card having a part close to the antenna coil of the module, to establish a coupling by induction between the two antenna coils.

Figure 2:
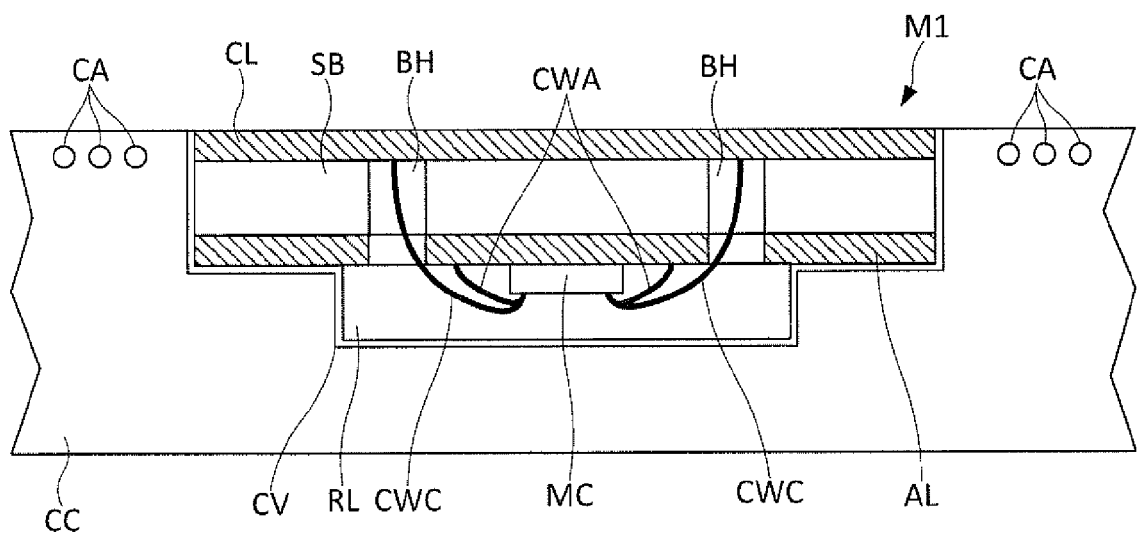
Figure 3:
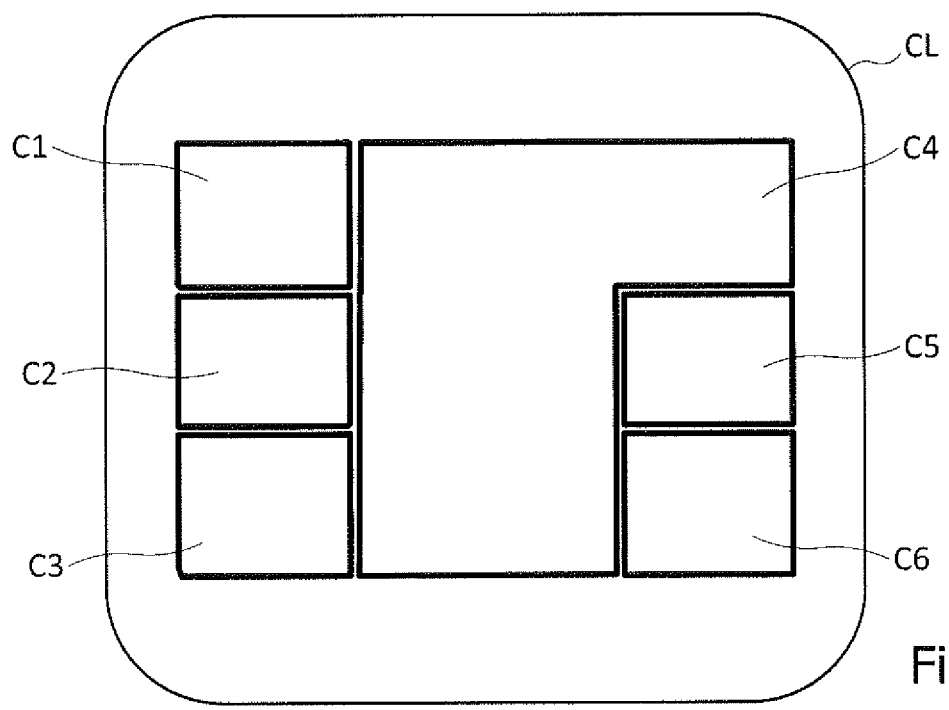
Figure 4:
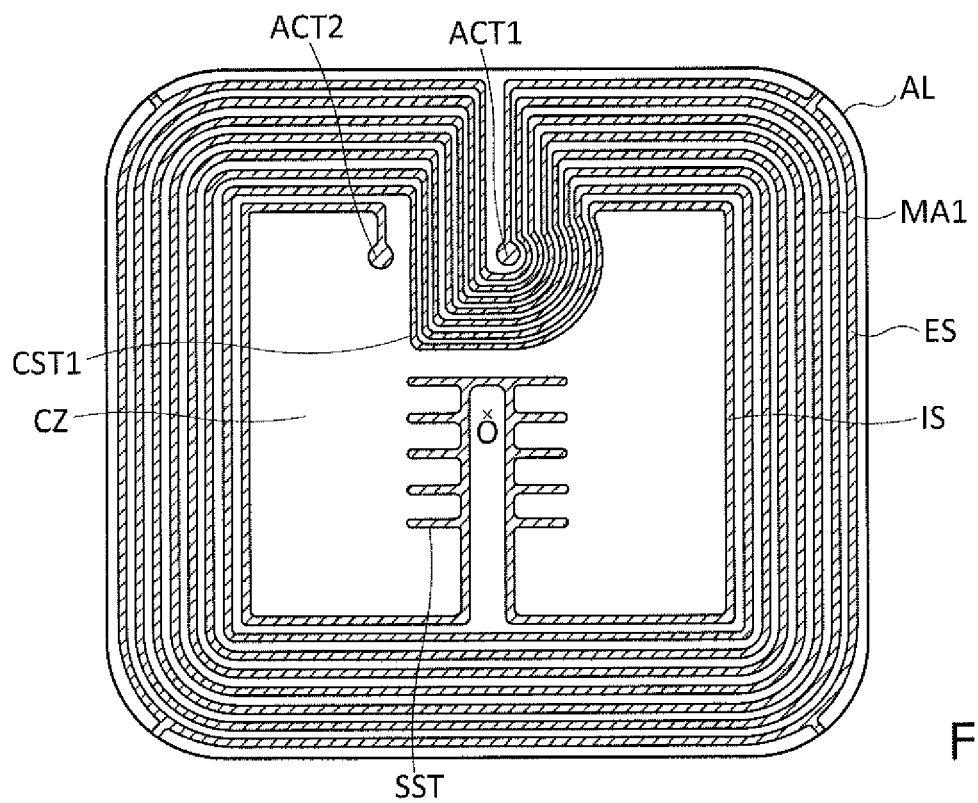
Figure 5:
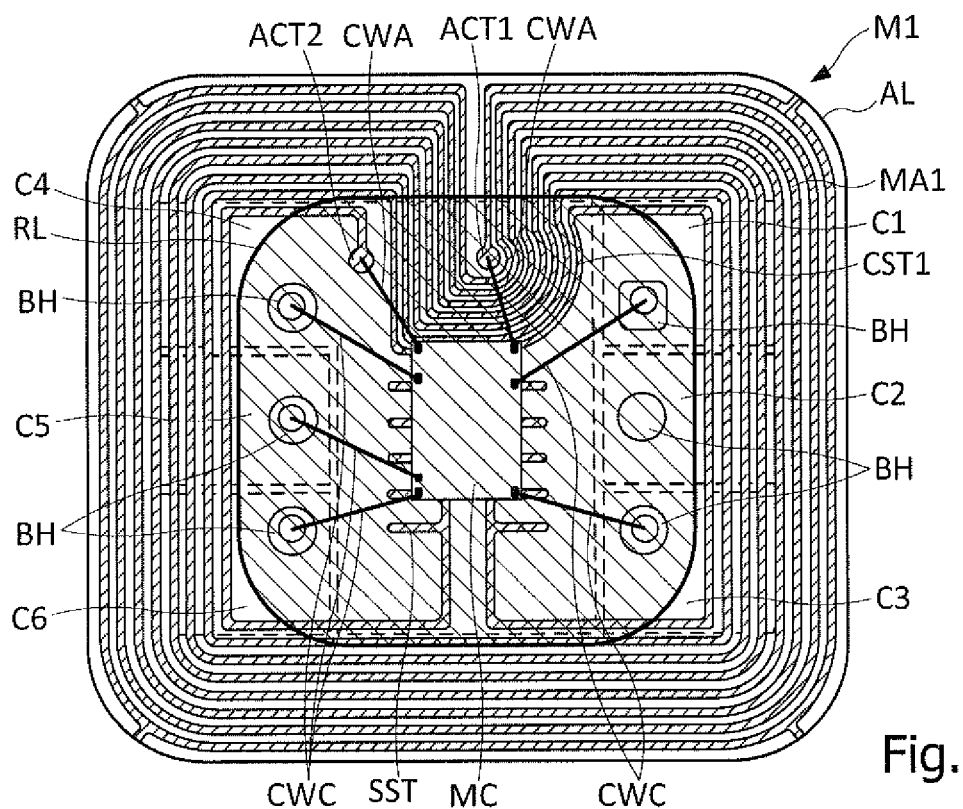
Figure 6:
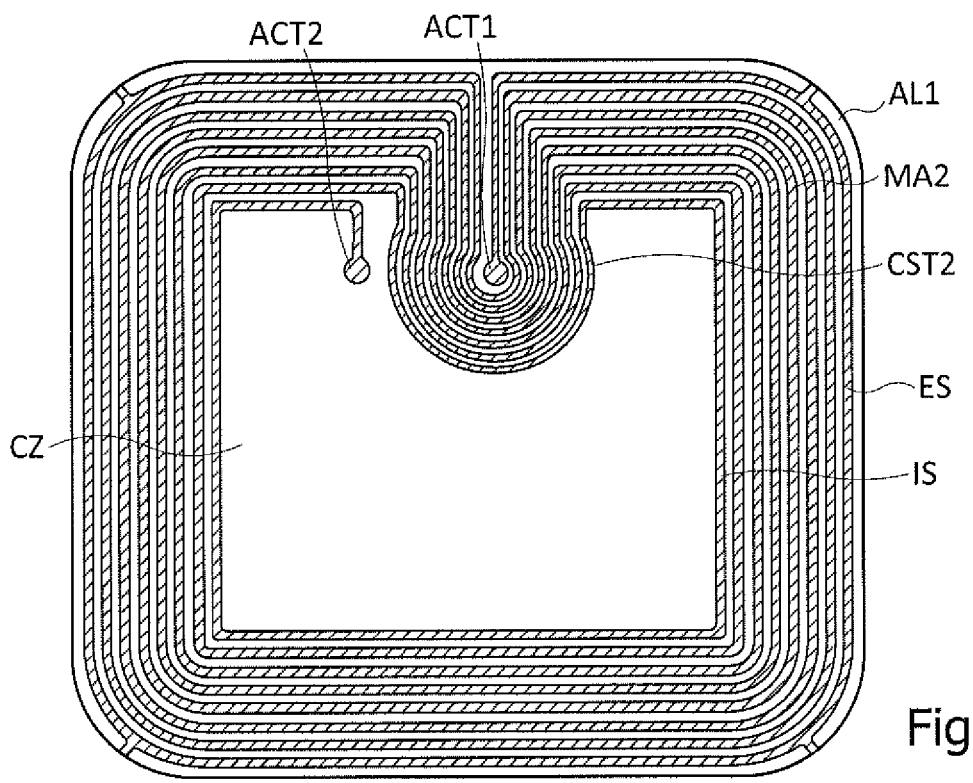
Figure 7:
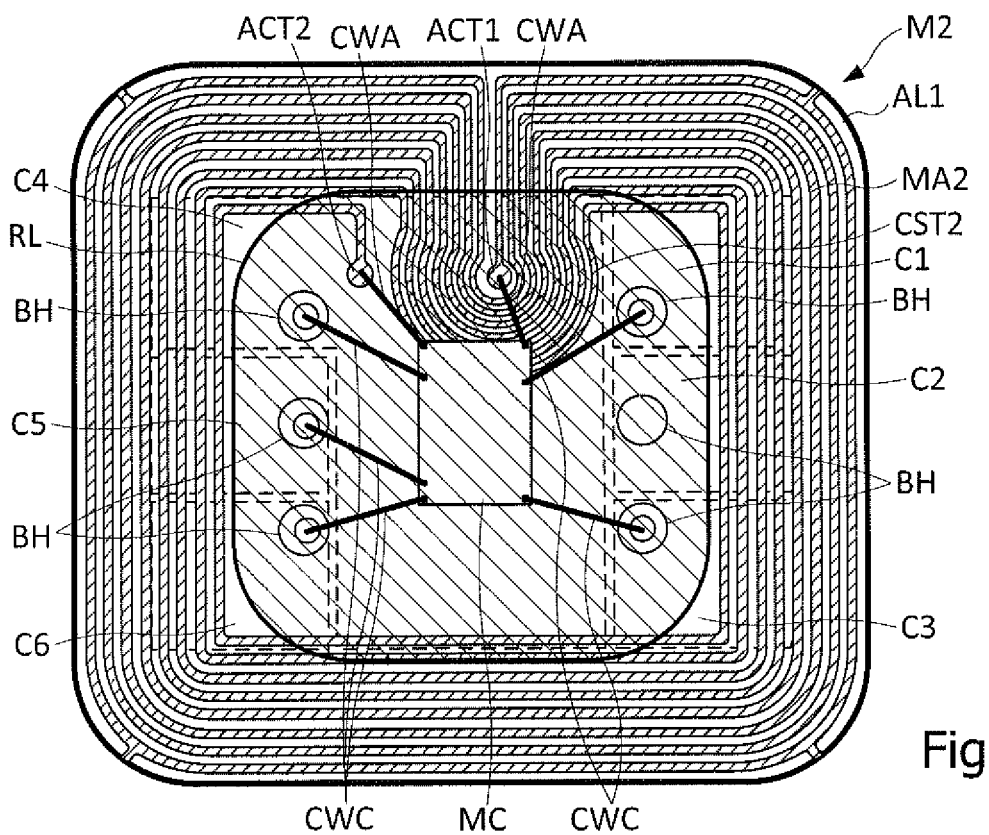
Figure 8:
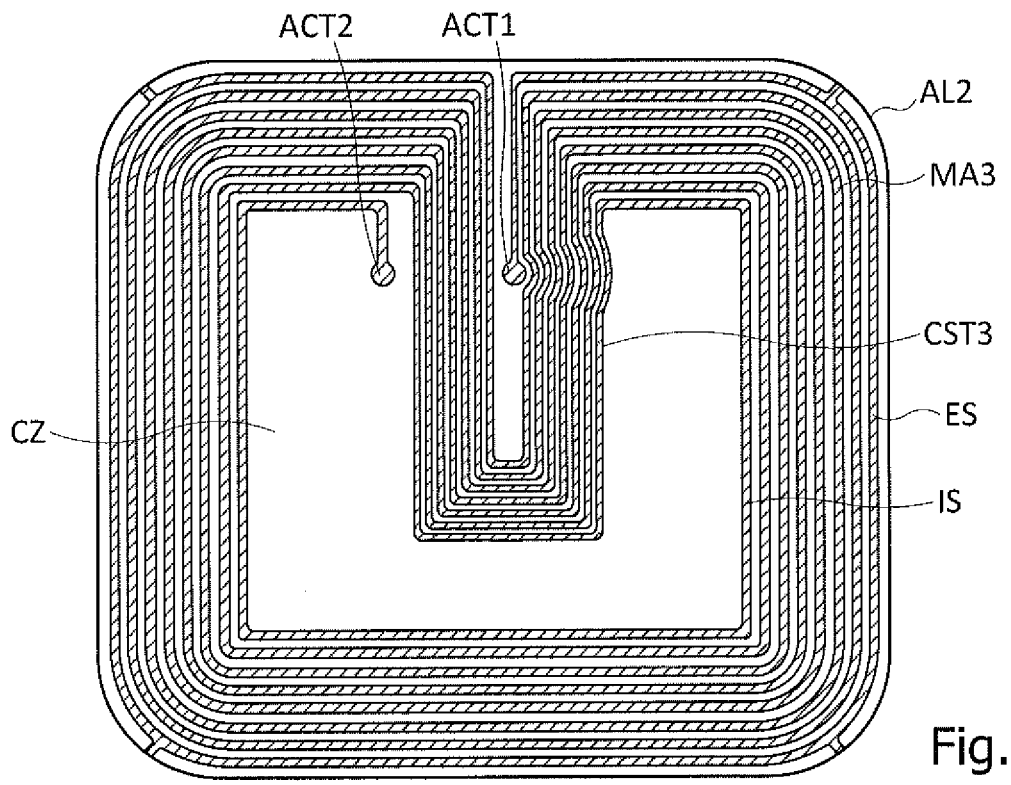
Figure 9:
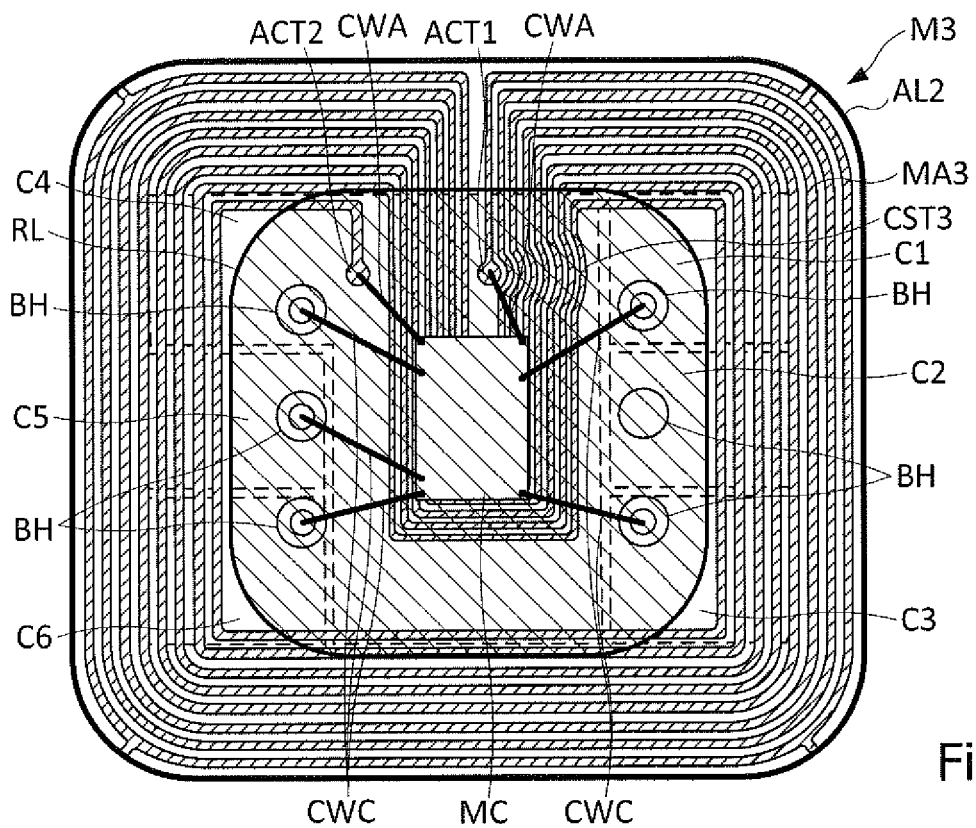
Figure 10:
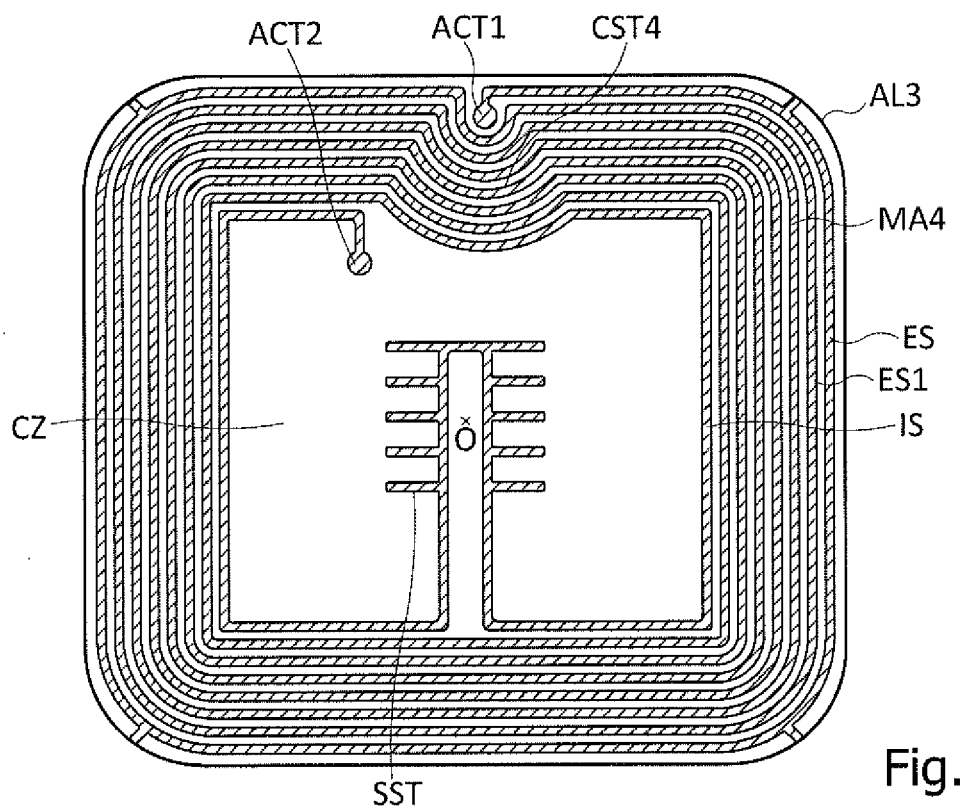
Figure 11:
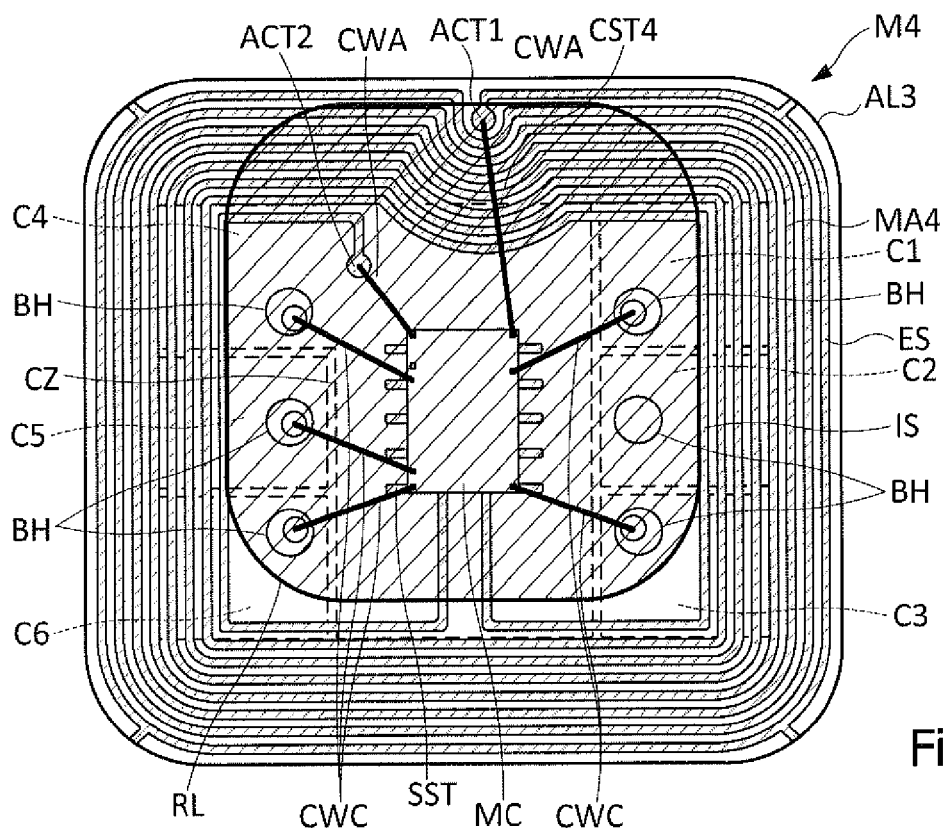
Figure 12:
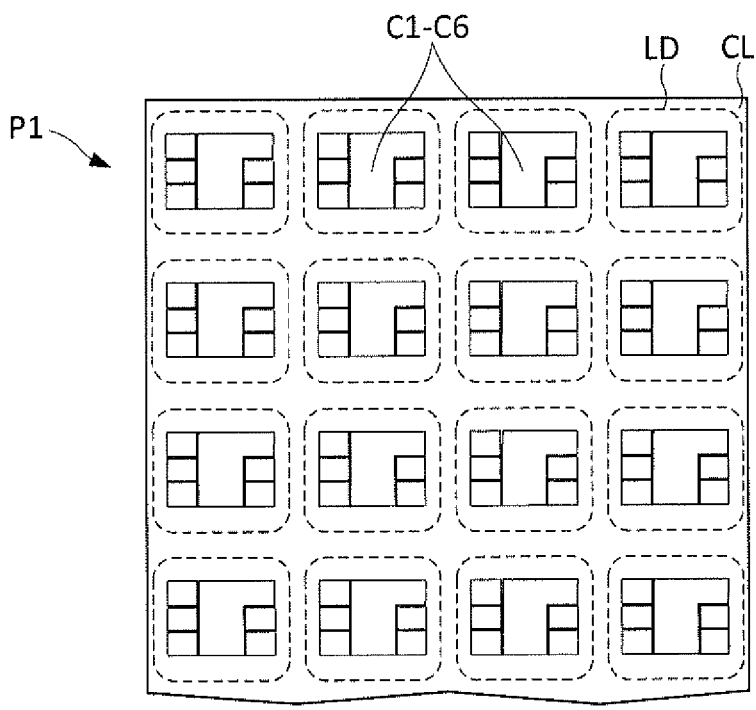
Figure 13:
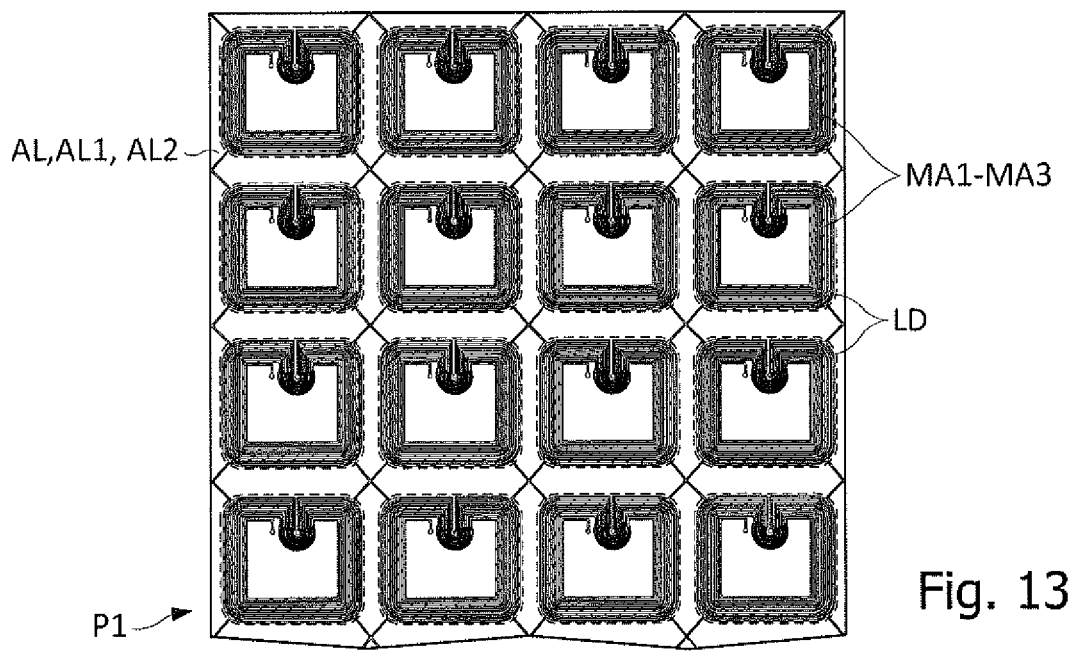
Figure 14:
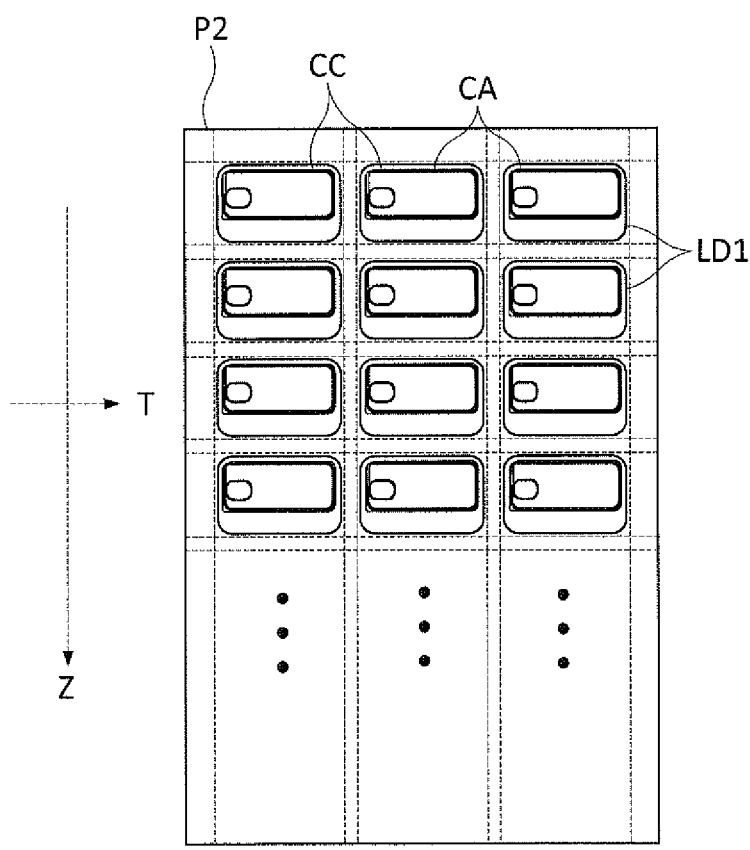

FIG. 1 represents a contactless microcircuit card, according to one embodiment,

FIG. 2 is a cross-section of the microcircuit card represented in FIG. 1, according to one embodiment, FIGS. 3 and 4 are views of front and rear faces of a wafer implanted into the microcircuit card represented in FIG. 1, according to one embodiment, FIG. 5 is a view of the rear face of a contactless module formed from the wafer of FIGS. 3 and 4, according to one embodiment, FIG. 6 is a view of the rear face of a wafer, according to another embodiment, FIG. 7 is a view of the rear face of a contactless module formed from the wafer in FIG. 6, FIG. 8 is a view of the rear face of a wafer, according to another embodiment, FIG. 9 is a view of the rear face of a contactless module formed from the wafer in FIG. 8, FIG. 10 is a view of the rear face of a wafer, according to another embodiment, FIG. 11 is a view of the rear face of a contactless module formed from the wafer in FIG. 10, FIGS. 12 and 13 are views of front and rear faces of a board in which several contactless modules are collectively formed, according to one embodiment, FIG. 14 represents a board in which several contactless microcircuit cards are collectively formed, according to one embodiment.

FIG. 1 represents a contactless microcircuit card CC comprising an antenna coil CA and a microcircuit module M1. The coil CA comprises several turns, for example from 2 to 4, and forms a large loop CA1 and a small loop CA2. The large loop CA1 follows the edge of the card CA, or only one part of this edge as shown by FIG. 1. The large loop CA1 can thus be near the edge of the card at a minimum distance which can reach 2 to 3 mm. The module comprises an antenna coil (not shown on FIG. 1) which can be disposed opposite the loop CA2. In this case, the coils of the module and of the card CC are implanted into the card at different depths.

According to one embodiment, the loop CL12 has an elongated shape the length of which, along an axis X1, is 20 to 50% greater than the width of the loop, along an axis Y1. The width of the loop CA2 is between 1 and 1.1 times the internal width of an antenna coil of the module M1, not shown on FIG. 1. Here, X1 and Y1 designate the longitudinal and transverse axes of the card CC.

FIG. 2 represents a cross-section of the card CC and the module M1 along the axis X1. The card CC comprises a cavity CV into which the module M1 is inserted. The module M1 comprises a wafer formed of an electrically insulating substrate SB, and of two electrically conducting layers CL, AL respectively covering a front face and a rear face of the substrate SB. The module M1 comprises a microcircuit MC which is secured onto the rear face of the wafer, i.e. on the layer AL. The microcircuit MC is coupled to contact pads formed in the layer CL, through wires CWC connected on one side to the microcircuit and passing in holes BH through the substrate SB to reach the contacts formed in the layer CL. The microcircuit MC is coupled to contact pads of an antenna coil formed in the layer AL, through wires CWA connected on one side to the microcircuit and on the other side to the layer AL. The assembly consisting of the microcircuit MC and the wires CWC, CWA is embedded in a layer of resin RL mechanically protecting the wires. The layer RL only extends over a central zone of the rear face of the layer AL.

FIGS. 3 and 4 are views of the front and rear faces of the wafer SB, i.e. of the layers CL and AL. In FIG. 3, the layer CL comprises contact pads C1, C2, C3, C4, C5, C6, for example having the shape specified by the ISO 7816 standard.

On FIG. 4, an antenna coil MA1 is formed in the layer AL, for example by etching. The antenna coil MA1 has the shape of a spiral comprising several turns, for example between 5 and 10 turns, including one external turn ES and one internal turn IS. In the example in FIG. 4, the coil MA1 comprises 8 turns. The antenna coil MA1 comprises two contact pads ACT1, ACT2 to connect the antenna coil to the microcircuit MC, i.e. a contact pad ACT1 coupled to the external turn ES and located outside the latter, and a contact pad ACT2 coupled to the internal turn IS and located inside the latter.

In the example in FIG. 4, the coil MA1 has a square shape with rounded angles. Other shapes can of course be considered. Thus, the coil MA1 may not have rounded angles, or may be circular.

According to one embodiment, the two contact pads ACT1, ACT2 of the antenna coil MA1 are located in a central zone CZ of the antenna coil delimited by the internal turn IS of the coil MA1, without taking into account a bypass zone CST1. In the zone CST1, the turns of the coil MA1 except for the turn ES, bypass the contact pad ACT1, by passing between the pad ACT1 and a central point O of the coil MA1. The external turn ES can follow the entire contour of the wafer SB except for a zone through which a conducting path coupling the contact pad ACT1 to the external turn ES can pass. The internal turn IS follows the entire contour of the central zone CZ except for a part located in the bypass zone CST1 where the turn bypasses the pad ACT1. In other words, the contact pads ACT1, ACT21 are located in the central zone CZ at a distance from the external contour of the coil greater than the distance between the turns ES and IS.

According to another embodiment, the layer AL comprises a support structure SST for supporting the microcircuit MC (not shown on FIG. 4). The structure SST can be independent from the coil MA1 or be coupled to the latter. In the example in FIG. 4, the structure is part of the internal turn IS of the coil MA1 opposite the contact pad ACT1. The structure SST comprises a U-shaped part with two parallel branches and a base bypassing the center O of the coil MA1, and several branches perpendicular to the branches of the U-shaped part attached to an external edge of the branches of the U-shaped part. It shall be noted that the structure SST could be separated from the internal turn of the coil MA1.

FIG. 5 represents the rear face of the module M1, showing the microcircuit MC, the connecting wires CWA, CWC, and the protection layer RL (hatched zone). On FIG. 5, the microcircuit MC rests partly on a part of the turns of the coil MA1 in the bypass zone CST1, and partly on the support structure SST. Given that the layer AL has a certain thickness, the structure enables the microcircuit MC to be maintained in a plane parallel to the face of the layer SB on which the layer AL is formed. The wires CWC are soldered to contact pads of the microcircuit MC and pass in holes BH through the layer AL and the wafer SB to reach the contacts C1-C6 formed in the layer CL, to which they are soldered. The wires CWA are soldered to contact pads of the microcircuit MC and to the contact pads ACT1 and ACT2. The layer RL includes the microcircuit MC and all the connecting wires CWC, CWA, while only covering a central part of the layer AL, surrounded by substantially all the turns of the coil MA1.

On FIGS. 4 and 5, the coil MA1 in the bypass zone CST1, has on one side a rounded shape, and on the other side, an angular extension to support the microcircuit MC across the entire width of the latter.

FIGS. 6 and 7 represent a layer AL1 replacing the layer AL and a module M2 comprising the layer AL1. In some cases, it may not be necessary to provide a support structure SST, in particular when it is acceptable for the microcircuit not to be rigorously disposed in parallel to the rear face of the wafer SB. Thus, on FIG. 6, the layer AL1 differs from the layer AL in that it does not comprise any support structure SST, but only a coil MA2 with the contact pads ACT1, ACT2, and a bypass zone CST2 in which the turns of the coil MA2 bypass the contact pad ACT1. Here again, the two contact pads ACT1, ACT2 are produced in the central zone CZ of the coil MA2 delimited by the internal turn IS of the coil MA2, without taking into account the bypass zone CST2. The contact pads ACT1, ACT2 are also located at a distance from the external contour of the coil greater than the distance between the turns ES and IS. In the example in FIG. 6, the turns of the coil in the bypass zone CST2 have substantially the shape of a semi-circle.

The module M2 represented in FIG. 7 differs from the one (M1) in FIG. 5 only in that the layer AL is replaced with the layer AL1 as represented in FIG. 6. On FIG. 7, the microcircuit MC rests partly on the layer AL1 forming the turns of the coil MA2 in the bypass zone CST2, and partly directly on the wafer SB. A layer of glue enabling the microcircuit MC to be maintained on the wafer, can at least partially make up for any difference in level corresponding to the thickness of the layer AL1.

FIGS. 8 and 9 represent a layer AL2 replacing the layer AL and a module M3 comprising the layer AL2. Thus, on FIG. 8, the layer AL2 differs from the layer AL in that it forms a bypass zone CST3 of the coil MA3. The turns of the coil MA3 in the zone CST3 are extended beyond the center of the coil to also form a support structure supporting the microcircuit MC. Here again, the two contact pads ACT1, ACT2 are produced in the central zone CZ delimited by the internal turn IS of the coil MA3, disregarding the bypass zone CST3.

The module M3 represented in FIG. 9 differs from the one in FIG. 5 only in that the layer AL is replaced with the layer AL2. On FIG. 9, the microcircuit MC rests entirely on the bypass zone CST3 of the coil MA3. In this way, the microcircuit MC is entirely supported by the layer AL2 and thus maintained in a plane parallel to the wafer SB.

FIGS. 10 and 11 represent a layer AL3 replacing the layer AL and a module M4 comprising the layer AL3. The layer AL3 forms an antenna coil MA4 which differs from the coil MA1 in that the external contact pad ACT1 is located inside a contour delimited by the external turn ES of the coil MA4, but not necessarily inside a contour delimited by the internal turn IS. In other words, the pad ACT1 is merely located at a distance from the central point O of the coil less than the distance between the turn ES and the point O.

In the example of FIGS. 10 and 11, the contact pad ACT1 is not located inside a contour delimited by the turn ES1 adjacent to the turn ES. The pad ACT1 is located at a distance from the point O substantially equal to the distance between the point O and the turn ES1. The coil MA4 comprises a bypass zone CST4 in which the turns of the coil MA4 except for the turn ES bypass the contact pad ACT1. In the example in FIG. 10, the turns of the coil MA4 in the bypass zone CST4 have substantially the shape of an arc of a circle. Furthermore, the layer AL3 may comprise the support structure SST for supporting the microcircuit MC. In the example in FIG. 10, the structure SST is coupled to the internal turn IS.

The module M4 represented in FIG. 11 differs from the one (M1) in FIG. 5 only in that the layer AL is replaced with the layer AL3 as represented in FIG. 10. On FIG. 11, the microcircuit MC rests on the support structure SST formed in the layer AL3. To protect the connecting wire CWA between the microcircuit MC and the pad ACT1, the protection layer RL is not disposed only on the central zone CZ, but extends near an edge of the module M4 on the pad ACT1.

According to one embodiment, the modules M1, M2, M3 or M4 are collectively produced by etching a board covered on each face with an electrically conducting layer, for example a layer made of copper. The board may be a double-sided printed-circuit board. FIGS. 12 and 13 represent the front and rear faces of a part of the board P1 after etching its two faces. On FIG. 12, the board P1 comprises several sets of contact pads C1-C6, for example conforming to the ISO 7816 standard. The sets of contact pads C1-C6 are distributed over the board P1 in rows and columns. On FIG. 13, several coils MA1-MA3 of module are formed on the rear face of the board P1, each coil being formed opposite a set of contact pads C1-C6.

In a next step, the board P1 can be drilled from the rear face (on the coils MA1-MA3 side) to form the holes BH up to the layer CL, in the central zone CZ of each coil. In a next step, a microcircuit MC can be placed in the center of each coil MA1-MA3, then connected using wires to the contact pads C1-C6 and to the contact pads ACT1, ACT2 of the coil. The layer of resin RL can then be formed to protect each microcircuit with its connecting wires. For this purpose, the entire rear face of the board P1 can be covered with a layer of resin then etched to substantially clear all the turns of the coils MA1-MA3. Alternatively, the layer of resin on each microcircuit can be molded using a mold having orifices with the desired dimensions, opposite each microcircuit MC secured onto the board P1. The modules M1-M3 can then be individualized by cutting the board P1 along cutting lines LD.

The board P1 can also be drilled to form the holes BH before being covered with the layers CL and AL, AL1 or AL2.

According to one embodiment, the card CC is collectively manufactured in boards made of polymer resin (PVC, PC or PET). Thus, FIG. 14 represents a board P2 in which card antenna coils CA are collectively formed. In the example in FIG. 13, the longitudinal axes of the cards are parallel to a transverse axis T of the board P2. The longitudinal axes of the cards CC can also be parallel to a longitudinal axis Z of the board P2. The coils CA can be collectively produced using a wire insulated in a sheath or by means of a varnish, which is gradually pushed into the card using ultrasounds capable of locally melting the card. The insulated wire is thus unwound following the route of the wire forming the turns of the coil to be formed. The wire may have a diameter of 50 to 150 μm. The spacing pitch between the turns may be of 150 to 500 μm. The cards are then individualized by cutting the board P2 along cutting lines LD1. The modules M1-M3 are then inserted into the individualized cards CC. For this purpose, a cavity is formed in each card, in a location precisely identified in relation to the edges of the card, and a module M1-M3 is introduced and secured into each cavity.

It will be understood by those skilled in the art that the present invention is susceptible of various alternative embodiments and various applications. In particular, the invention is not limited to a module with two contact or contactless communication interfaces, but can also apply to a module comprising only one communication interface comprising only one antenna coil. The present invention is not limited either to cards having the format defined by the ISO 7816 standard, or to contacts C1-C6 conforming to this standard.

Furthermore, the protection layer RL may not be necessary, or may be formed when the module is inserted into a cavity formed in a card.

The invention claimed is:

1. A method for manufacturing a contactless microcircuit antenna coil, comprising steps of:
   depositing a first electrically conducting layer on a first face of a wafer, and
   forming in the first layer an antenna coil in a spiral comprising several turns, comprising an internal turn coupled to an internal contact pad and an external turn coupled to an external contact pad,
   wherein the external turn follows the entire contour of antenna coil except for a zone through which a conducting path coupling the external contact pad to the external turn can pass, the external and internal contact pads of the antenna coil being formed in a central zone of the external turn, the antenna coil comprising a bypass zone in which each turn passes around the external contact pad in the central zone.

2. The method according to claim 1, wherein the bypass zone of the antenna coil is pre-formed to support a microcircuit across the entire width and at least partially over the length of the latter.

3. The method according to claim 1, wherein the layer comprises a support structure for supporting a microcircuit, the support structure being able to be coupled to the internal turn of the antenna coil.

4. The method according to claim 1, comprising steps of:
   depositing a second electrically conducting layer on a second face of the wafer,
   forming contact pads in the second layer, and
   forming holes in the wafer from the first layer, down to the contact pads of the second layer.

5. A method for manufacturing a contactless module, comprising steps of:
   executing the method according to claim 1,
   securing a microcircuit onto a central zone of the antenna coil, and
   coupling contact pads of the microcircuit to the contact pads of the antenna coil, through wires.

6. The method according to claim 5, comprising steps of:
   depositing a second electrically conducting layer on a second face of the wafer
   forming contact pads in the second layer, and
   forming holes in the wafer from the first layer, down to the contact pads of the second layer, and
   coupling contact pads of the microcircuit to the contact pads of the second layer through wires passing in the holes.

7. The method according to claim 5, comprising a step of depositing an electrically insulating protection layer on the microcircuit and the connecting wires.

8. The method according to claim 5, wherein the wafer belongs to a board in which several contactless modules are collectively formed, the method comprising a step of cutting the board to individualize the modules, performed after connecting each microcircuit.

9. The method for manufacturing a microcircuit card comprising steps of:
   executing the method according to claim 5, to obtain a contactless module,
   forming an antenna coil in a card, and
   implanting the module into the card, the antenna coil of the card having a part close to the antenna coil of the microcircuit to establish a coupling by induction between the two antenna coils.

10. The method according to claim 5, wherein the card belongs to a board in which contactless microcircuit cards are collectively formed, the method comprising a step of cutting the board to individualize the cards, performed after forming the card antenna coils in the board, and before implanting one module into each card.

11. A contactless microcircuit antenna coil, comprising:
a wafer covered on a first face with a first layer in which an antenna coil is formed, the antenna coil comprising several turns in a spiral, including an internal turn coupled to a contact pad inside the internal turn and an external turn coupled to an external contact pad,
wherein the external turn follows the entire contour of antenna coil except for a zone through which a conducting path coupling the external contact pad to the external turn can pass, the external and internal contact pads of the antenna coil being formed in a central zone of the external turn, the antenna coil comprising a bypass zone in which each turn passes around the external contact pad.

12. The antenna coil according to claim 11, wherein the turns in the bypass zone are pre-formed to support a microcircuit across the entire width and at least partially over the length of the latter.

13. The antenna coil according to claim 11, wherein the first layer comprises a support structure to support a microcircuit, the support structure being able to be coupled to the internal turn of the antenna coil.

14. The antenna coil according to claim 11, comprising a second electrically conducting layer covering a second face of the wafer, the second layer forming contact pads, and holes passing through the wafer from the first face and reaching the contact pads of the second layer.

15. A contactless module comprising:
an antenna coil according to claim 11, and
a microcircuit secured onto a central zone of the antenna coil and comprising contact pads coupled to the contact pads of the antenna coil through wires.

16. The contactless module according to claim 15, comprising a second electrically conducting layer covering a second face of the wafer, the second layer forming contact pads, and wires coupling contact pads of the microcircuit to the contact pads of the second layer, by passing through holes formed in the wafer from the first layer and reaching the contact pads of the second layer.

17. The contactless module according to claim 15, comprising an electrically insulating protection layer covering the microcircuit and the connecting wires.

18. A microcircuit card comprising an antenna coil and a module according to claim 15, the antenna coil of the card having a part close to the antenna coil of the module, to establish a coupling by induction between the two antenna coils.

* * * * *